United States Patent
Burkle

(10) Patent No.: US 9,864,009 B1
(45) Date of Patent: Jan. 9, 2018

(54) ZONE SELECTIVE INTERLOCKING TEST APPARATUS

(71) Applicant: EATON CORPORATION, Cleveland, OH (US)

(72) Inventor: Alec Dane Burkle, Hendersonville, NC (US)

(73) Assignee: EATON CORPORATION, Cleveland, OH (US)

( * ) Notice: Subject to any disclaimer, the term of this patent is extended or adjusted under 35 U.S.C. 154(b) by 27 days.

(21) Appl. No.: 15/183,317

(22) Filed: Jun. 15, 2016

(51) Int. Cl.
*G01R 31/327* (2006.01)
*H02H 7/26* (2006.01)

(52) U.S. Cl.
CPC ..... *G01R 31/3275* (2013.01); *G01R 31/3274* (2013.01); *H02H 7/261* (2013.01)

(58) Field of Classification Search
CPC .......... H02H 3/044; H02H 3/05; H02H 3/335; H02H 3/0935; H02H 7/30; H02H 7/261; H02H 7/262
See application file for complete search history.

(56) References Cited

U.S. PATENT DOCUMENTS

| 6,744,254 B2* | 6/2004 | Clarey | H02H 3/044 |
| | | | 324/424 |
| 8,280,653 B2 | 10/2012 | Lagree | |
| 9,692,224 B2* | 6/2017 | Louco | H02H 3/08 |

* cited by examiner

*Primary Examiner* — Minh N Tang
(74) *Attorney, Agent, or Firm* — Eckert Seamans; Philip Levy

(57) ABSTRACT

A ZSI testing apparatus includes a fault generation circuit, a plurality of cable assemblies coupled to the fault generation circuit, wherein the cable assemblies are structured to be selectively coupled to selected circuit interrupters, a human machine interface, and a controller coupled. The controller is configured to: (i) selectively cause a fault current to be provided to a number of the cable assemblies, (ii) receive an input from each circuit interrupter that is coupled to one of the cable assemblies, each input being indicative of a trip signal output of the circuit interrupter, (iii) determine based on the received inputs (a) that an error has occurred with respect to operation of the circuit interrupters and (b) a recommendation for fixing the error, and (iv) cause an output indicative of the error and the recommendation to be provided on the human machine interface.

12 Claims, 4 Drawing Sheets

ZONE SELECTIVE INTERLOCKING TEST APPARATUS

BACKGROUND

Field

The present invention pertains to electrical distribution systems having circuit interrupters that employ zone selective interlocking, and, in particular, to a test apparatus for testing the zone selective interlocking of such a system.

Background Information

Circuit interrupters, such as, for example and without limitation, circuit breakers, are used to protect electrical circuitry from damage due to an overcurrent condition, such as an overload condition, a short circuit, or another fault condition, such as an arc fault or a ground fault. Molded case circuit breakers typically include a pair of separable contacts per phase. The separable contacts may be operated either manually by way of a handle disposed on the outside of the case or automatically in response to a detected fault condition. Typically, such circuit breakers include an operating mechanism, which is designed to rapidly open and close the separable contacts, and a trip mechanism, such as an electronic trip unit, which senses a number of fault conditions to trip the breaker automatically. Upon sensing a fault condition, the trip unit trips the operating mechanism to a trip state, which moves the separable contacts to their open position.

Zone selective interlocking (ZSI) is a communication scheme used with circuit interrupters, such as, without limitation, circuit breakers and protective relays, to improve the level of protection in a power distribution system. In a power distribution system employing ZSI, the circuit interrupter devices are organized into a number of zones, and the ZSI functionality is achieved through communication between the downstream and upstream devices. Typically, the zones are classified by their location downstream of the main circuit interrupter, which is generally defined as zone 1. The purpose of ZSI is to speed up tripping for some faults without sacrificing the coordination of the system. ZSI circuit interrupter devices can communicate across distribution zones to determine whether or not a device sees a fault condition. In operation, ZSI monitors phase and ground faults between devices in separate zones. If a downstream device (e.g., in zone 2) detects a fault, the trip unit of that device will send a signal upstream to one or more devices to acknowledge that it has recognized the fault. This signal keeps upstream devices from interrupting quickly, therefore maintaining power to the rest of the system. If the downstream device fails, the upstream device will trip instantaneously after a predetermined delay, provided the fault exceeds the short delay pickup set for that device. Thus, in ZSI, if a fault occurs, the circuit interrupter device closest to the fault will be given the opportunity to clear the condition without disrupting service to other areas supplied by the system.

SUMMARY

In one embodiment, an apparatus (6) for testing the zone selective interlocking functionality of an electrical system including a plurality of circuit interrupters is provided. The apparatus includes a fault generation circuit structured to generate a fault current, a plurality of cable assemblies coupled to the fault generation circuit, wherein the cable assemblies are structured to be selectively coupled to selected ones of the circuit interrupters, and a human machine interface. Apparatus further includes a controller coupled to the fault generation circuit and to the plurality of cable assemblies. The controller is structured and configured to: (i) selectively cause the fault current to be provided to a number of the cable assemblies so that the fault current can in turn be provided to the circuit interrupter coupled to each of the number of the cable assemblies, (ii) receive an input from each circuit interrupter that is coupled to one of the cable assemblies, each input being indicative of a trip signal output of the circuit interrupter, (iii) determine based on the received inputs (a) that an error has occurred with respect to operation of the circuit interrupters and (b) a recommendation for fixing the error, and (iv) cause an output indicative of the error and the recommendation to be provided on the human machine interface.

In another embodiment, a method for testing the zone selective interlocking functionality of an electrical system (2, 2') including a plurality of circuit interrupters (22) is provided. The method includes coupling a plurality of cable assemblies (52A, 52B, 52C) to selected ones of the circuit interrupters, generating a fault current, providing the fault current to a number of the cable assemblies and in turn to the circuit interrupter coupled to each of the number of the cable assemblies, and receiving an input from each circuit interrupter that is coupled to one of the cable assemblies, each input being indicative of a trip signal output of the circuit interrupter. The method further includes determining based on the received inputs (i) that an error has occurred with respect to operation of the circuit interrupters and (ii) a recommendation for fixing the error, and providing an output indicative of the error and the recommendation.

DESCRIPTION OF THE PREFERRED EMBODIMENTS

Figure 1:
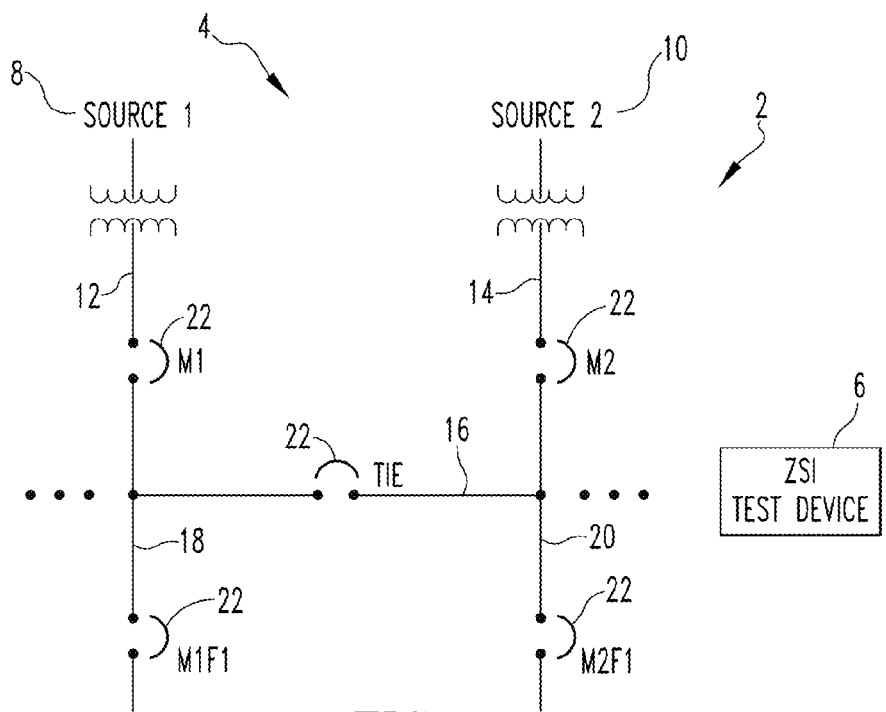
FIG. 1 is a schematic diagram of a system according to an exemplary embodiment of the disclosed concept.

As used herein, the singular form of "a", "an", and "the" include plural references unless the context clearly dictates otherwise.

As used herein, the statement that two or more parts or elements are "coupled" shall mean that the parts are joined or operate together either directly or indirectly, i.e., through one or more intermediate parts or elements, so long as a link occurs.

As used herein, "directly coupled" means that two elements are directly in contact with each other.

As used herein, "fixedly coupled" or "fixed" means that two elements are coupled so as to move as one while maintaining a constant orientation relative to each other.

As used herein, the word "unitary" means a part is created as a single piece or unit. That is, a part that includes pieces that are created separately and then coupled together as a unit is not a "unitary" part or body.

As used herein, the statement that two or more parts or elements "engage" one another shall mean that the parts exert a force against one another either directly or through one or more intermediate parts or elements.

As used herein, the term "number" shall mean one or an integer greater than one (i.e., a plurality).

As used herein, the term "controller" means a programmable analog and/or digital device (including associated memory part or portion) that can store, retrieve, execute and process data (e.g., software routines and/or information used by such routines), including, without limitation, a personal computer, a workstation, a microprocessor, a microcontroller, a microcomputer, a central processing unit, a programmable logic controller, a mainframe computer, a minicomputer, a server, a networked processor, or any suitable processing device or apparatus.

As used herein, the term "single ended arrangement" means a portion of an electrical distribution system that includes one main circuit interrupter and one or more feeder lines each having at least one feeder circuit interrupter therein.

As used herein, the term "double ended arrangement" means a portion of an electrical distribution system that includes two main circuit interrupters, at least one tie circuit interrupter, and one or more feeder lines each having at least one feeder circuit interrupter therein. Each double ended arrangement includes two single ended arrangements therein as a sub set thereof.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

FIG. 1 is a schematic diagram of a system 2 according to an exemplary embodiment of the disclosed concept. As seen in FIG. 1, system 2 includes an electrical distribution system 4 comprising a double ended arrangement that employs ZSI, and a ZSI test device 6 which is configured to test the ZSI functionality of electrical distribution system 4.

In particular, electrical distribution system 4 includes a first main source 8 and a second main source 10, which in the exemplary embodiment are each 3-phase AC sources. It will be understood, however, that the disclosed concept may also be used in connection with single phase AC sources and DC sources. Electrical distribution system 4 further includes a first main distribution line 12 coupled to first main source 8 and a second main distribution line 14 coupled to second main source 10. A tie distribution line 16 connects first main distribution line 12 to second main distribution line 14. A number of first feeder lines 18 (with one being shown for illustrative purposes, but more than one with an associated circuit interrupter may also be present) are directly coupled to first main distribution line 12, and a number of second feeder lines 20 (with one being shown for illustrative purposes, but more than one with an associated circuit interrupter may also be present) are directly coupled to second main distribution line 14. In addition, as seen in FIG. 1, electrical distribution system 4 further includes a plurality of circuit breakers 22 (or another type of circuit interrupter) which are, as described elsewhere herein, configured to implement ZSI within electrical distribution system 4. In the illustrated embodiment, the plurality of circuit breakers 22 include a first main circuit breaker 22, labeled M1, that is provided within first main distribution line 12, a second main circuit breaker 22, labeled M2, that is provided within second main distribution line 14, a tie circuit breaker 22, labeled TIE, that is provided within tie distribution line 16, a main 1 feeder circuit breaker 22, labeled M1F1, that is provided within first feeder line 18, and a main 2 feeder circuit breaker 22, labeled M2F1, that is provided within second feeder line 20. As described in greater detail herein, ZSI test device 6 is able to be selectively connected to up to three of the circuit breakers 22 at a time (each possible connection scheme being referred to herein as a "configuration") in order to test the ZSI functionality of electrical distribution system 4 according to particular exemplary test sequences described herein.

Figure 2:
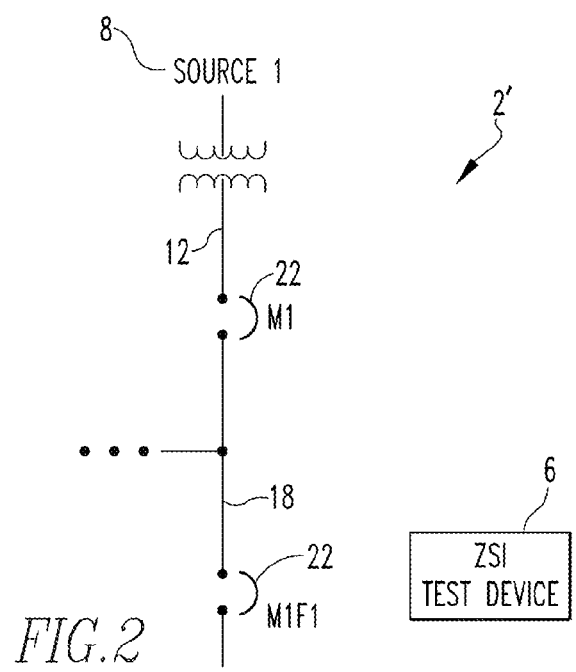
FIG. 2 is a schematic diagram of a system according to an alternative exemplary embodiment of the disclosed concept.

FIG. 2 is a schematic diagram of a system 2' according to another, alternative exemplary embodiment of the disclosed concept. As seen in FIG. 2, system 2' is similar to system 2, and like parts are labeled with like reference numerals. System 2' differs from system 2 in that it includes an electrical distribution system 4' comprising a single ended arrangement that employs ZSI. System 2', like system 2, employs ZSI test device 6 to test the ZSI functionality of electrical distribution system 4'.

Thus, as described in greater detail herein, ZSI test device 6 of the exemplary embodiment allows for selective ZSI testing of both single ended and double ended arrangements in electrical distribution systems. Furthermore, it is to be understood that this is not meant to be limiting, and that the disclosed concept may be employed for testing of arrangements that have more than two main circuit breakers and more than a single tie circuit breaker.

Figure 3:
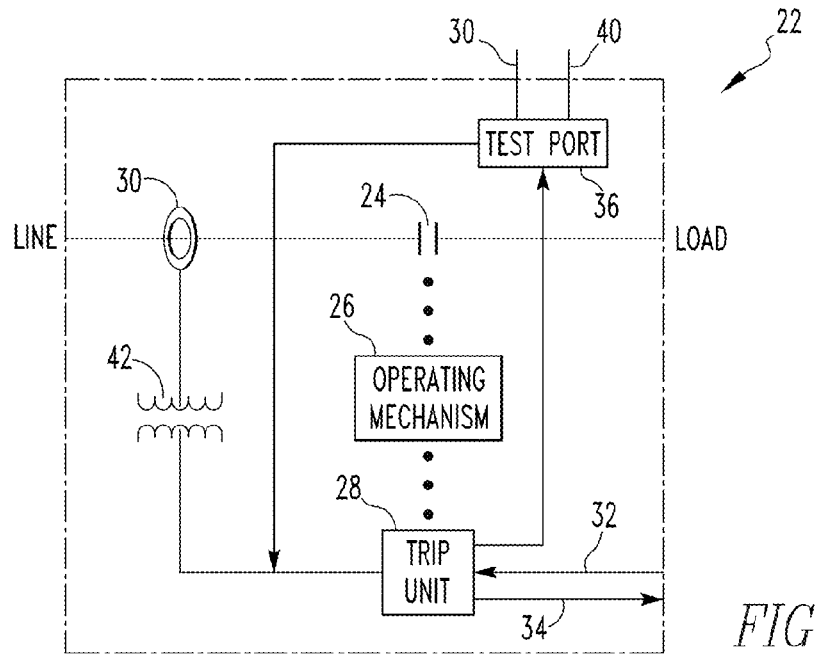
FIG. 3 is a schematic diagram of a circuit breaker according to a non-limiting exemplary embodiment of the disclosed concept.

FIG. 3 is a schematic diagram of circuit breaker 22 according to a non-limiting exemplary embodiment of the disclosed concept. As seen in FIG. 3, circuit breaker 22 includes separable contacts 24, an operating mechanism 26 structured to open and close separable contacts 24, and an electronic trip unit 28 which cooperates with operating mechanism 26 to trip open separable contacts 24. A current transformer 30 is operatively coupled to trip unit 28 and is structured to measure the current passing through circuit breaker 22. Trip unit 28 is structured to, based on the measurements it receives, determine whether and when to issue a trip signal for tripping open separable contacts 24 through operating mechanism 26. Trip unit 28 also includes a zone selected interlocking input 32 and a selective interlocking output 34, which are used to communicate the information necessary to implement ZSI in a well-known manner.

In addition, as seen in FIG. 3, circuit breaker 22 further includes a test port 36 that includes a number of input connectors 38 and a number of output connectors 40. Input connectors 38 are structured to receive a fault current for test purposes as described in more detail elsewhere herein. As seen in FIG. 3, test port 36 is structured to provide that fault current to trip unit 28 at a location that is downstream of current transformer 30 and instrumentation transformer 42 of circuit breaker 22. As a result, a relatively small fault current at a level sufficient to put trip unit 28 into a short or ground fault mode (e.g., without limitation, 200 mA at 24 V DC) is able to be provided to circuit breaker 22 for testing purposes. As also seen in FIG. 3, output connectors 40 are structured to receive a voltage from trip unit 28 that is representative of the state of the trip signal thereof.

Figure 4:
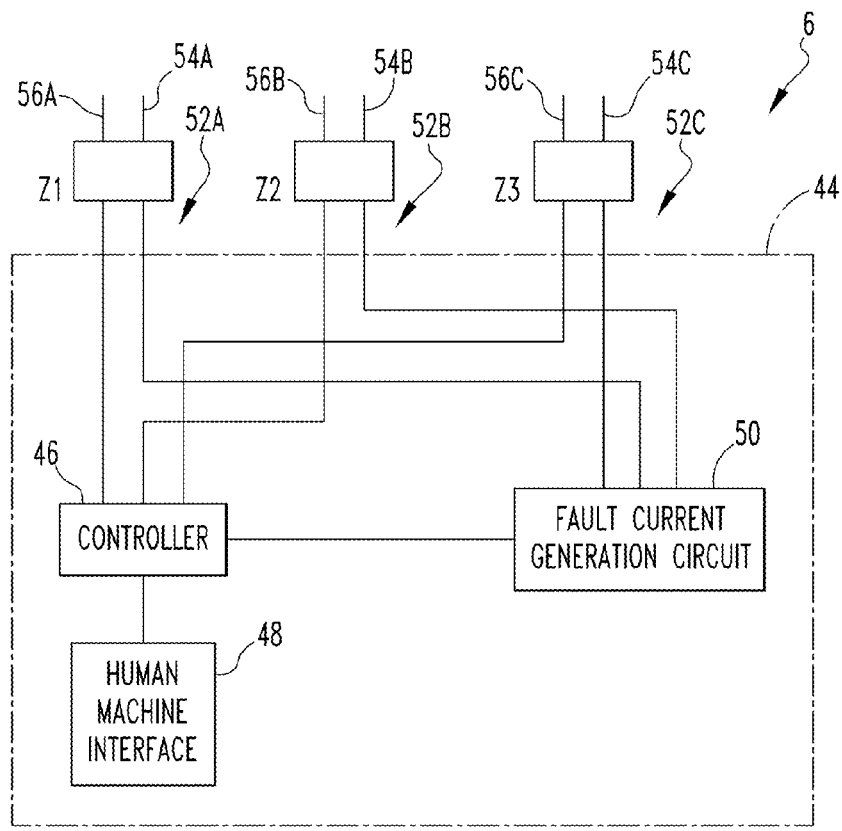
FIG. 4 is a schematic diagram of a ZSI test device according to an exemplary embodiment of the disclosed concept.

FIG. 4 is a schematic diagram of ZSI test device 6 according to an exemplary embodiment of the disclosed concept. ZSI test device 6 includes a housing 44 for containing the internal components of ZSI test circuit 6. Provided within housing 44 are a controller 46, which in the exemplary embodiment comprises a programmable logic controller (PLC), a human machine interface 48, such as, without limitation, a display in the form of an LCD touchscreen, coupled to controller 46, and a fault current generation circuit 50. Fault current generation circuit 50 is, under the control of controller 46, structured to generate the fault currents that are used to test ZSI functionality as described herein. In particular, as seen in FIG. 4, ZSI test device 6 also includes a first cable assembly 52A, a second cable assembly 52B, and a third cable assembly 52C. Each cable assembly 52A, 52B, 52C is structured to be selectively connected to test port 36 of any of the circuit breakers 22. In particular, each cable assembly 52A, 52B, 52C includes a number of first connectors 54 structured to be electrically connected to the number of input connectors 38 of test port 36, and a number of second connectors 56 structured to be electrically connected to the number of output connectors 40 of test port 36. Furthermore, ZSI test device 6 is structured to be able to selectively cause fault current generation circuit 50 to provide a fault current to one or more of the cable assemblies 52A, 52B, 52C (i.e., to the number of first connectors 54 thereof) as required according to the test particular sequence being performed. In addition, cable assembly 52A is labeled Z1, for zone 1, cable assembly 52B is labeled Z2, for zone 2, and cable assembly 52C is labeled Z3, for zone 3. The significance of this labeling convention is described herein.

According to the exemplary embodiment of the disclosed concept, two different test sequences are provided for testing ZSI functionality depending upon the type of arrangement being tested. A first particular test sequence as described herein is applied for a single ended arrangement, and thus may be used with system 2' of FIG. 2, and a second particular test sequence as described herein is applied for a double ended arrangement and thus may be used with system 2 of FIG. 1. Moreover, each test sequence specifies a number of individual tests to be performed, wherein each test includes a specified configuration to be used and a specified type of fault to be injected. In the exemplary embodiment, ZSI test device 6 is able to be connected (via cable assemblies 52A, 52B, 52C) to up to three of the circuit breakers 22 at any one time in six different configurations. The six different configurations are set forth in TABLE 1 below, which shows, for each configuration, both the arrangement involved and which circuit breaker is to be connected to each of the identified cable assemblies 52.

TABLE 1

| Configuration | Arrangement | Z1 | Z2 | Z3 |
|---|---|---|---|---|
| 1 | Double Ended | M1 | Tie | M2F1 |
| 2 | Double Ended | M2 | Tie | M1F1 |
| 3 | Single Ended | M1 | M1F1 | N/A |
| 4 | Single Ended | M2 | M2F1 | N/A |
| 5 | Double Ended | M1 | M2 | M2F1 |
| 6 | Double Ended | M2 | M1 | M1F1 |

Also in the exemplary embodiment, ZSI test device 6 is able to inject four different types of faults into a connected circuit breaker 22, namely a main fault, a tie fault, a feeder fault, and a simultaneous main fault. According to an aspect of the disclosed concept, a mechanism is provided for enabling an operator to choose the type of fault to be injected into a particular configuration (i.e., the type of fault test to be performed), preferably in the form of an input touchscreen provided by human machine interface 48. The four different faults that may be injected are described in TABLE 2 below.

TABLE 2

| Configuration | Arrangement | Fault Descriptions |
|---|---|---|
| 1 | Double Ended | Main Fault = This simulates a fault originating on the load side of the M1 (Main 1) breaker before the tie breaker.<br>Tie Fault = This simulates a fault on originating on the load side of the M1 (Main 1) breaker after the tie breaker.<br>Feeder Fault = This simulates a fault originating on the load side of a feeder on the Main 2 bus (Main 2 feeder). This fault would flow through main 1, the tie breaker, and the main 2 feeder breaker. |
| 2 | Double Ended | Main Fault = This simulates a fault originating on the load side of the M2 (Main 2) breaker before the tie breaker.<br>Tie Fault = This simulates a fault on originating on the load side of the M2 (Main 2) breaker after the tie breaker.<br>Feeder Fault = This simulates a fault originating on the load side of a feeder on the Main 1 bus (Main 1 feeder). This fault would flow through main 2, the tie breaker, and the main 1 feeder breaker. |
| 3 | Single Ended | Main Fault = This simulates a fault originating on the load side of the main 1 breaker.<br>Feeder Fault = This simulates a fault originating on the load side of the main 1 feeder breaker. |
| 4 | Single Ended | Main Fault = This simulates a fault originating on the load side of the main 2 breaker.<br>Feeder Fault = This simulates a fault originating on the load side of the main 2 feeder breaker. |
| 5 | Double Ended (Main + Opposite Feeder Fault) | Simultaneous Main Fault = This simulates simultaneous faults. One originates on the load side of the main 1 breaker before the tie and the other originates on the load side of the main 2 feeder. |

TABLE 2-continued

| Configuration | Arrangement | Fault Descriptions |
|---|---|---|
| 6 | Double Ended (Main + Opposite Feeder Fault) | Simultaneous Main Fault = This simulates simultaneous faults. One originates on the load side of the main 2 breaker before the tie and the other originates on the load side of the main 1 feeder. |

According to still a further aspect of the disclosed concept, controller 46 of the ZSI test device 6 implements control logic (e.g., in the form of one or more stored software routines) that is configured to (i) determine whether the ZSI functionality is operating properly, and (ii) if not functioning properly, that a particular issue is likely causing the problem. In particular, for each possible configuration and for each type of fault that is injected, the control logic will, for each circuit breaker 22 in the configuration, expect (based on stored data) either: (i) no trip signal to be issued by the associated trip unit 28, or (ii) a trip signal to be issued by the associated trip unit 28 within a certain predetermined time period from the fault injection. As noted elsewhere herein, the state of the trip signal of each connected circuit breaker 22 is indicated by the voltage that is provided to ZSI test device 6 from the test port 36 of the circuit breaker 22 (i.e., through the connection between number of output connectors 40 and the number of connectors 56). Thus, based on the particular inputs that are received in ZSI test device 6 in response to the applied fault current or currents, the control logic of controller 46 is able to determine whether the ZSI functionality is operating properly, and if not, identify a particular problem that is likely to be the cause of the malfunction. As described in more detail elsewhere herein, the control logic of controller 46 is also configured to provide feedback to the operator through human machine interface 48 based on the results of the testing and stored data indicating the expected results. In the exemplary embodiment, such feedback will include either an indication that the test has been passed, or, if the test has not been passed, a likely cause of the problem and suggested solution to the problem (i.e., a "troubleshooting solution") that are based on stored data.

Furthermore, as will be appreciated, the logic implemented in controller 46 as just described will assume that certain predetermined trip settings are saved and enabled in trip unit 28 of each circuit breaker 22. Thus, an aspect of the disclosed concept as described herein includes instructing the operator to make sure that each trip unit 28 of each circuit breaker 22 is configured using the required trip settings prior to commencing any testing. As will be appreciated, those predetermined trip settings will be based on and correspond to the level of the fault current that will be injected. The predetermined trip settings for the non-limiting exemplary embodiment, which correspond to a fault current of 2×In, are shown in TABLE 3 below.

TABLE 3

| Parameter | Setting |
|---|---|
| Long PU | 0.4 |
| Short PU | 3×Ir |
| Short Time Delay*** | Z1 = .5 s, Z2 = .3 s, Z1 = .1 s |
| INST PU | 4×In |

Figure 5:
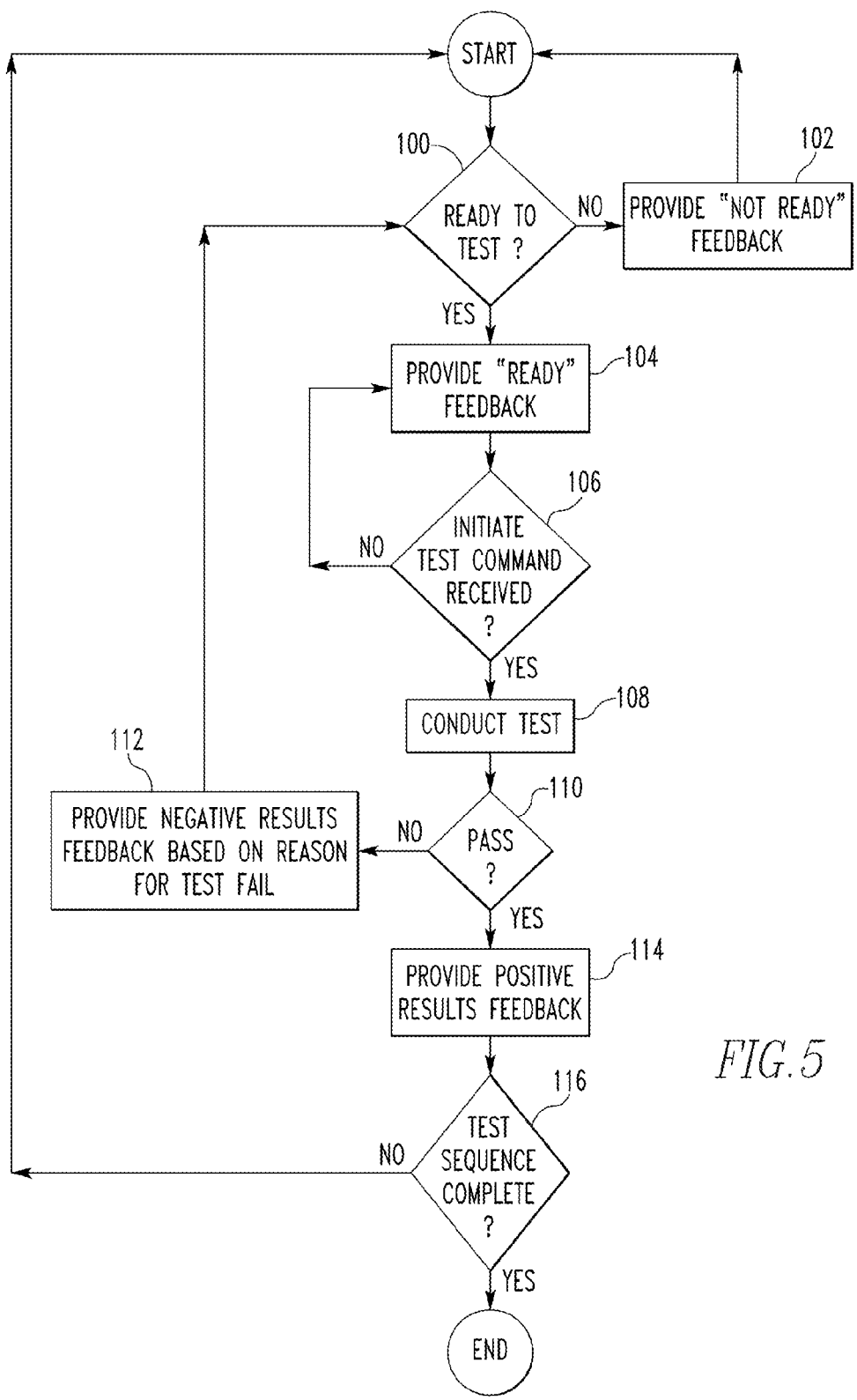
FIG. 5 is a flowchart showing a method of operation of the ZSI test device of FIG. 4 according to an exemplary embodiment.

FIG. 5 is a flowchart showing a method of operation of ZSI test circuit 6 (i.e., operation of the control logic of controller 46 thereof) according to one exemplary, non-limiting embodiment of the disclosed concept. The method begins at step 100, wherein controller 46 makes a determination as to whether sufficient connections between the cable assemblies 52A, 52B, 52C and the appropriate test ports 36 have been properly made (i.e., has each cable assembly 52A, 52B, 52C been properly seated within the test port 36) such that testing may begin. If the answer is no, then, at step 102, a "Not Ready to Test" message is provided to the operator through human machine interface 48, preferably in the form of a message displayed thereon (see FIG. 6 described below). The feedback may also include an instruction to check that each connection has been securely made. The method will then return to step 100 to once again to check whether testing may begin. If the answer at step 100 is yes, then, at step 104, a "Ready to Test" message is provided to the operator through human machine interface 48, preferably in the form of a message displayed thereon (see FIG. 6 described below). Next, at step 106, a determination is made as to whether an initiate test command has been received from the operator (see FIG. 6 described below). If the answer is no, then the method returns to step 104 to wait for such a command. If the answer is yes, then, at step 108, the proper test is conducted by causing the correct fault current or currents to be generated in response thereto receiving the inputs as described herein. Next, at step 110, a determination is made as to whether the test in question has been passed. If the answer at step 110 is no, then, at step 112, the control logic determines, based on stored data and the inputs received, the likely cause of the failure and a troubleshooting solution for addressing that cause. As seen in step 112, such negative results feedback is provided to the operator through human machine interface 48, preferably in the form of a message displayed thereon (see FIG. 6 described below). The method then returns to step 100 so that the test in question may be performed again. If, however, the answer at step 110 is yes, then, at step 114, a positive results feedback message is provided through human machine interface 48, preferably in the form of a message displayed thereon (see FIG. 6 described below). The method then proceeds to step 116, wherein a determination is made as to whether the test sequence has been completed (i.e., have all of the individual tests within the test sequence been completed). If the answer is no, then the method returns to the start so that the next individual test in the test sequence may be performed. If the answer is yes, the method ends.

According to one particular exemplary embodiment, step 112 may be performed by first determining whether the circuit breaker 22 in question tripped to slowly in response to the injected fault current. If the answer is yes, then the negative results feedback message may instruct the operator to check for a restraining signal jumper or for the presence of a ZSI input signal at the input 32 of the circuit breaker 22. If it was not determined that the circuit breaker 22 in question tripped to slowly, then it is determined whether the circuit breaker 22 in question tripped too quickly. If the answer is yes, then the negative results feedback message may instruct the operator that the zone in question is not seeing a restrain signal and that the operator should check the continuity of the upstream zone input 32 and the downstream zone output 34. If the circuit breaker 22 in question did not trip too quickly, then it is determined whether the trip occurred in the wrong zone. If the trip did occur in the wrong zone, then the negative results feedback message may instruct the operator to check the trip unit settings of each circuit breaker 22 in the configuration and/or the placement of cable assemblies 52A, 52B, 52C. Finally, if the wrong zone was not tripped, but instead none of the circuit breakers 22 is tripped, then the negative results feedback message may instruct the operator to check the trip unit settings of each circuit breaker 22 in the configuration. It will be appreciated that this is just one exemplary implementation that may be employed, and that numerous other implementations are also possible. For example, Tables 4, 5 and 6 illustrate another exemplary embodiment for implementing the disclosed concept. More specifically, Table 4 shows the type of error/error message and the troubleshooting solution to be displayed for various arrangements and faults for Z1, Table 4 shows the type of error/error message and the troubleshooting solution to be displayed for various arrangements and faults for Z2, and Table 6 shows the type of error/error message and the troubleshooting solution to be displayed for various arrangements and faults for Z3.

TABLE 4

| Arrangement and Type of Fault Injected | Error Detected - Error Message | Troubleshooting Solution |
|---|---|---|
| Single/Double - MAIN FAULT | Z1 TRIPPED TOO SLOW | CHECK ZI(B8) CONNECTION ON Z1. Z1 IS RECEIVING RESTRAIN SIGNAL. ENSURE SELF-RESTRAINING JUMPER IS NOT INSTALLED |
| Single/Double - MAIN FAULT | Z1 DIDN'T TRIP | CHECK TRIP UNIT SETTINGS AND ZSI CONFIGURATION MAP TO ENSURE TRIP PLUGS ARE INSTALLED IN CORRECT BREAKERS |
| Single/Double - MAIN FAULT | Z2 TRIPPED DURING Z1 TEST | CHECK TRIP UNIT SETTINGS AND ZSI CONFIGURATION MAP TO ENSURE TRIP PLUGS ARE INSTALLED IN CORRECT BREAKERS |
| Single/Double - MAIN FAULT | Z3 TRIPPED DURING Z1 TEST | CHECK TRIP UNIT SETTINGS AND ZSI CONFIGURATION MAP TO ENSURE TRIP PLUGS ARE INSTALLED IN CORRECT BREAKERS |

TABLE 5

| Arrangement and Type of Fault Injected | Error Detected - Error Message | Troubleshooting Solution |
|---|---|---|
| Double - Tie | Z2 TRIPPPED TOO SLOW | ENSURE Z2 DOES NOT HAVE RESTRAIN JUMPER INSTALLED FROM ZI(B8) TO ZO(B9) ON Z2 ZSI CONTACTS |
| Single - Feeder | Z2 TRIPPPED TOO FAST | ENSURE Z2 HAS RESTRAIN JUMPER INSTALLED FROM ZI(B8) TO ZO(B9) ON Z2 ZSI CONTACTS |
| Double - Tie | Z2 TRIPPPED TOO FAST | Z2 MAY NOT BE RECEIVING RESTRAIN SIGNAL, CHECK CONTINUITY FROM Z2-ZI(B8) TO Z3-ZO(B9) |
| Single - Feeder | Z2 DID NOT TRIP | CHECK TRIP UNIT SETTINGS AND ZSI CONFIGURATION MAP TO ENSURE TRIP PLUGS ARE INSTALLED IN CORRECT BREAKERS |
| Single/Double - Feeder/Tie | Z1 TRIPPED DURING Z2 TEST | CHECK TRIP UNIT SETTINGS AND ZSI CONFIGURATION MAP TO ENSURE TRIP PLUGS ARE INSTALLED IN CORRECT BREAKERS |
| Double - Tie | Z3 TRIPPED DURING Z2 TEST | CHECK TRIP UNIT SETTINGS AND ZSI CONFIGURATION MAP TO ENSURE TRIP PLUGS ARE INSTALLED IN CORRECT BREAKERS |

TABLE 6

| Arrangement and Type of Fault Injected | Error Detected - Error Message | Troubleshooting Solution |
|---|---|---|
| Double - Feeder Fault - 3 zones selected | Z3 TRIPPPED TOO SLOW | CHECK TRIP UNIT SETTINGS AND ZSI CONFIGURATION MAP TO ENSURE TRIP PLUGS ARE INSTALLED IN CORRECT BREAKERS |
| Double - Feeder Fault - 3 zones selected | Z3 TRIPPPED TOO FAST | ENSURE Z3 HAS RESTRAIN JUMPER INSTALLED FROM ZI(B8) TO ZO(B9) ON Z3 ZSI CONTACTS |
| Double - Feeder Fault - 3 zones selected | Z3 DIDN'T TRIP | CHECK TRIP UNIT SETTINGS AND ZSI CONFIGURATION MAP TO ENSURE TRIP PLUGS ARE INSTALLED IN CORRECT BREAKERS |
| Double - Feeder Fault - 3 zones selected | Z2 TRIPPED DURING Z3 TEST | Z2 MAY NOT BE RECEIVING RESTRAIN SIGNAL, CHECK CONTINUITY FROM Z2-ZI(B8) TO Z3-Z0(B9) |
| Double - Feeder Fault - 3 zones selected | Z1 TRIPPED DURING Z3 TEST | Z1 MAY NOT BE RECEIVING RESTRAIN SIGNAL, CHECK CONTINUITY FROM Z1 ZSI SIGNAL ZI(B8) TO Z2 ZSI SIGNAL Z0(B9) |
| Double - Feeder Fault - 3 zones selected | Z1 AND Z3 DID NOT TRIP | CHECK TRIP UNIT SETTINGS AND ZSI CONFIGURATION MAP TO ENSURE TRIP PLUGS ARE INSTALLED IN CORRECT BREAKERS |

Moreover, as noted elsewhere herein, in the exemplary embodiment, two different test sequences are provided for testing ZSI functionality depending upon the type of arrangement being tested. For single ended arrangements, a first particular test sequence is applied as follows. First, ZSI test device 6 is connected in either configuration 3 or configuration 4, and a main fault test is performed. After performing the main fault test, a feeder fault test is performed (M1F1 or M2F1, as appropriate). After performing the feeder fault test, the appropriate cable assembly 52 is disconnected from M1F1 or M2F1, as appropriate, and a feeder fault test is performed on each additional feeder in the structure. For double ended arrangements, a second particular test sequence is applied as follows. First, ZSI test device 6 is connected in configuration 1, and a main fault test, a tie fault test, and a feeder fault test is performed. After performing the feeder fault test on M2F1, M2F1 is disconnected and a feeder fault test is performed on all other M2 feeders. Next, ZSI test device 6 is connected in configuration 2, and a main fault test, a tie fault test, and a feeder test is performed. After performing the feeder fault test on M1F1, M1F1 is disconnected and a feeder fault test is performed on all other M1 feeders. Next, ZSI test device 6 is connected in configuration 6, and a simultaneous main fault is performed. Finally, ZSI test device 6 is connected in configuration 5, and a simultaneous main fault is performed.

Figure 6:
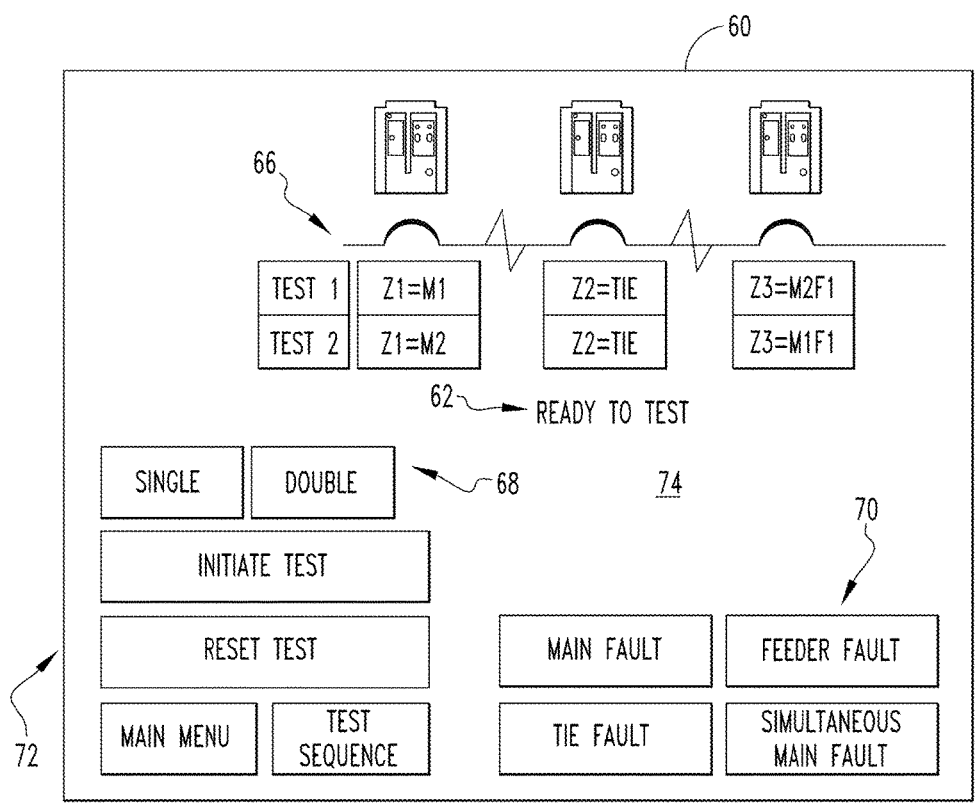
FIG. 6 is a depiction of a test screen according to an exemplary embodiment of the disclosed concept.

FIG. 6 is a depiction of an exemplary test screen 60 that may be generated by human machine interface 48 according to an exemplary embodiment of the disclosed concept. In the illustrated embodiment, test screen 60 is a touchscreen generated by controller 46 and provided on human machine interface 48 (e.g. an LCD display) in order to enable an operator to input information into ZSI test device 6 and to enable ZSI test device 6 to output information to an operator in accordance with the disclosed concept. Test screen 60 includes a first information portion 62 for providing a message to an operator in accordance with steps 100, 102 and 104 of FIG. 5. Test screen 60 also includes a configuration portion 64 that displays the configurations that are valid based on other selections made using test screen 60. Test screen 60 also includes a portion 66 for displaying the output of the test indicating each trip signal state after a test is conducted. Test screen 60 still further includes a button portions 68, 70 and 72. Button portion 68 allows an operator to select the type of arrangement that is going to be tested. Button portion 70 allows the operator to specify the type of fault test that is to be initiated. Button portion 72 includes buttons for enabling an operator to initiate the selected test, reset the testing sequence, and to navigate to a test sequence screen which describes the available test sequences or to a main menu screen which is the main menu for control of the ZSI test device 6. Finally, test screen 60 includes an information portion 74 where the results feedback described in connection with steps 112 and 114 of FIG. 5 may be displayed to the operator. For example, any of the error messages and troubleshooting solutions shown in Tables 4, 5 and 6 may be displayed in information portion 74.

The disclosed concept thus provides a zone selected interlocking diagnostic and troubleshooting tool by which an operator is able to: (i) configure an electrical system for various ZSI related tests, (ii) conduct those tests, and (iii) receive constructive feedback including the results of the tests and recommendations as to how any detected problems may be addressed (e.g., from checking the continuity between 2 points to ensuring that the test cables are connected to the proper breaker).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An apparatus for testing the zone selective interlocking functionality of an electrical system including a plurality of circuit interrupters, comprising:
    a fault generation circuit structured to generate a fault current;
    a plurality of cable assemblies coupled to the fault generation circuit, wherein the cable assemblies are structured to be selectively coupled to selected ones of the circuit interrupters;
    a human machine interface; and
    a controller coupled to the fault generation circuit and to the plurality of cable assemblies, the controller being structured and configured to: (i) selectively cause the fault current to be provided to a number of the cable assemblies so that the fault current can in turn be provided to the circuit interrupter coupled to each of the number of the cable assemblies, (ii) receive an input from each circuit interrupter that is coupled to one of the cable assemblies, each input being indicative of a trip signal output of the circuit interrupter, (iii) determine based on the received inputs (a) that an error has occurred with respect to operation of the circuit interrupters and (b) a recommendation for fixing the error, and (iv) cause an output indicative of the error and the recommendation to be provided on the human machine interface.

2. The apparatus according to claim 1, wherein the cable assemblies are structured to be selectively coupled to selected ones of the circuit interrupters according to a plurality of predetermined configurations, wherein for each of the predetermined configurations two or more of the cable assemblies are coupled to particular ones of circuit interrupters, wherein the controller is structured and configured to, for each of the predetermined configurations, selectively cause a plurality of fault test types to be performed, and wherein for each of the predetermined configurations and each of the fault test types associated therewith, the controller is structured and configured to cause the fault current to be provided to predetermined ones of the cable assemblies.

3. The apparatus according to claim 2, wherein the controller stores, for each predetermined configuration and each associated fault test type, trip information that indicates for each circuit interrupter in the predetermined configuration: (i) whether the circuit interrupter should have tripped, and (ii) if the circuit interrupter should have tripped, a predetermined time from receipt of the fault current within which the circuit interrupter should have tripped.

4. The apparatus according to claim 3, wherein the controller is structured and configured to determine that the error has occurred based on the received inputs and the stored trip information.

5. The apparatus according to claim 4, wherein the test fault types include a main fault, a tie fault, a feeder fault, and a simultaneous main fault.

6. The apparatus according to claim 3, wherein a first one or more of the predetermined configurations are for use with a single ended arrangement and a second one or more of the predetermined configurations are for use with a double ended arrangement, and wherein the controller is structured and configured to enable selection of testing for either a double ended arrangement or a single ended arrangement.

7. The apparatus according to claim 1, wherein the controller is structured and configured to cause the output indicative of the error and the recommendation to be visually displayed on a display of the human machine interface.

8. A method for testing the zone selective interlocking functionality of an electrical system including a plurality of circuit interrupters, comprising:
    coupling a plurality of cable assemblies to selected ones of the circuit interrupters;

generating a fault current;

providing the fault current to a number of the cable assemblies and in turn to the circuit interrupter coupled to each of the number of the cable assemblies;

receiving an input from each circuit interrupter that is coupled to one of the cable assemblies, each input being indicative of a trip signal output of the circuit interrupter;

determining based on the received inputs (i) that an error has occurred with respect to operation of the circuit interrupters and (ii) a recommendation for fixing the error; and providing an output indicative of the error and the recommendation.

9. The method according to claim 8, wherein the providing an output comprises visually displaying the output on human machine interface.

10. The method according to claim 8, wherein the plurality of cable assemblies are connected to the selected ones of the circuit interrupters according to a predetermined configuration, the method further comprising receiving information relating to a type of arrangement being tested and a type of fault test to be conducted and determining which of the number of cable assemblies receives the fault current based on the predetermined configuration, the type of arrangement, and the type of fault test.

11. The method according to claim 10, wherein the determining that the error has occurred and the determining the recommendation are based on the predetermined configuration, the type of arrangement, the type of fault test and stored trip information that indicates for each circuit interrupter in the predetermined configuration: (i) whether the circuit interrupter should have tripped, and (ii) if the circuit interrupter should have tripped, a predetermined time from receipt of the fault current within which the circuit interrupter should have tripped.

12. The method according to claim 10, wherein the type of fault test is one or more of a main fault, a tie fault, a feeder fault, and a simultaneous main fault.

\* \* \* \* \*